(12) United States Patent
Ebbers et al.

(10) Patent No.: US 8,513,948 B2
(45) Date of Patent: Aug. 20, 2013

(54) MICROELECTROMECHANICAL STRUCTURE (MEMS) MONITORING

(75) Inventors: Jonathan P. Ebbers, South Burlington, VT (US); Kenneth J. Goodnow, Essex, VT (US); Stephen Gerard Shuma, Underhill, VT (US); Peter A. Twombly, Shelburne, VT (US)

(73) Assignee: International Business Machines Corporation, Armonk, NY (US)

( * ) Notice: Subject to any disclaimer, the term of this patent is extended or adjusted under 35 U.S.C. 154(b) by 313 days.

(21) Appl. No.: 12/951,515

(22) Filed: Nov. 22, 2010

(65) Prior Publication Data
US 2012/0126836 A1    May 24, 2012

(51) Int. Cl.
*G01R 31/327*    (2006.01)
*G01R 27/26*    (2006.01)

(52) U.S. Cl.
USPC .......................................... 324/415; 324/658

(58) Field of Classification Search
USPC .................................................. 324/415, 658
See application file for complete search history.

(56) References Cited

U.S. PATENT DOCUMENTS

| 6,094,116 | A | 7/2000 | Tai et al. | |
| 6,908,201 | B2 | 6/2005 | Gudeman et al. | |
| 7,205,173 | B2 | 4/2007 | Brunson et al. | |
| 7,317,232 | B2 | 1/2008 | Busta | |
| 7,479,785 | B2 * | 1/2009 | Liu et al. | 324/415 |
| 7,495,882 | B2 * | 2/2009 | Petz et al. | 361/277 |
| 8,134,375 | B2 * | 3/2012 | Boom | 324/679 |

* cited by examiner

*Primary Examiner* — Amy He
(74) *Attorney, Agent, or Firm* — Anthony J. Canale; Hoffman Warnick LLC (57) ABSTRACT

A MEMS component is monitored to determine its status. Sensors are deployed to sense the MEMS component and produce detection signals that are analyzed to determine the MEMS component state. An indicator device alerts a user of the status, particularly if the MEMS component has failed. Additionally, the MEMS component monitoring system may be practiced as a design structure encoded on computer readable storage media as part of a circuit design system.

21 Claims, 5 Drawing Sheets

MICROELECTROMECHANICAL STRUCTURE (MEMS) MONITORING

BACKGROUND

The present invention relates to microelectromechanical structures (MEMS), and, more specifically, to structures and methods for monitoring components of MEMS and to design structures on which embodiments of the present invention may reside.

As the use of MEMS becomes more pervasive, the number of MEMS on, for example, an integrated circuit increases. In the event of failure of a component of a MEMS, the function of the affected MEMS could be assumed by another MEMS or otherwise compensated for by the system in which the MEMS operates. However, determining whether a MEMS is intact can pose a significant problem. The result is that in many MEMS, component failure goes undetected and can lead to undesirable results. A structure and/or method for detecting MEMS component status so that such component failure can be taken into account could help to avoid such undesirable results.

SUMMARY

According to one embodiment of the present invention, a MEMS component status detection structure comprises at least one sensor arranged to monitor a MEMS component. The at least one sensor produces at least one detection signal responsive to a characteristic of the MEMS component. A control circuit produces a notification signal responsive to a comparison of the at least one detection signal to a predefined value. A notification device produces an indication of a status of the MEMS component responsive to the notification signal.

In another embodiment, a design structure embodied in a machine readable storage medium used in a design process includes a structure for detecting a MEMS component status with a controller having a control circuit and a notification device. At least one sensor is arranged to monitor a MEMS component and sends to the controller at least one detection signal responsive to a characteristic of a MEMS component. The control circuit produces a notification signal responsive to a comparison of the at least one detection signal to a predefined value, and a notification device produces an indication responsive to the notification signal that indicates a status of the MEMS component.

A method of detecting status of a MEMS component according to an embodiment includes sampling at least one sensor to obtain a respective detection signal responsive to a MEMS component and comparing each detection signal to a reference value. A notification signal is produced in a first state responsive to a first result of the comparing and a second state responsive to a second result of the comparing. Status of the MEMS component is determined responsive to the state of the notification signal.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION OF THE SEVERAL VIEWS OF THE DRAWINGS

Figure 1:
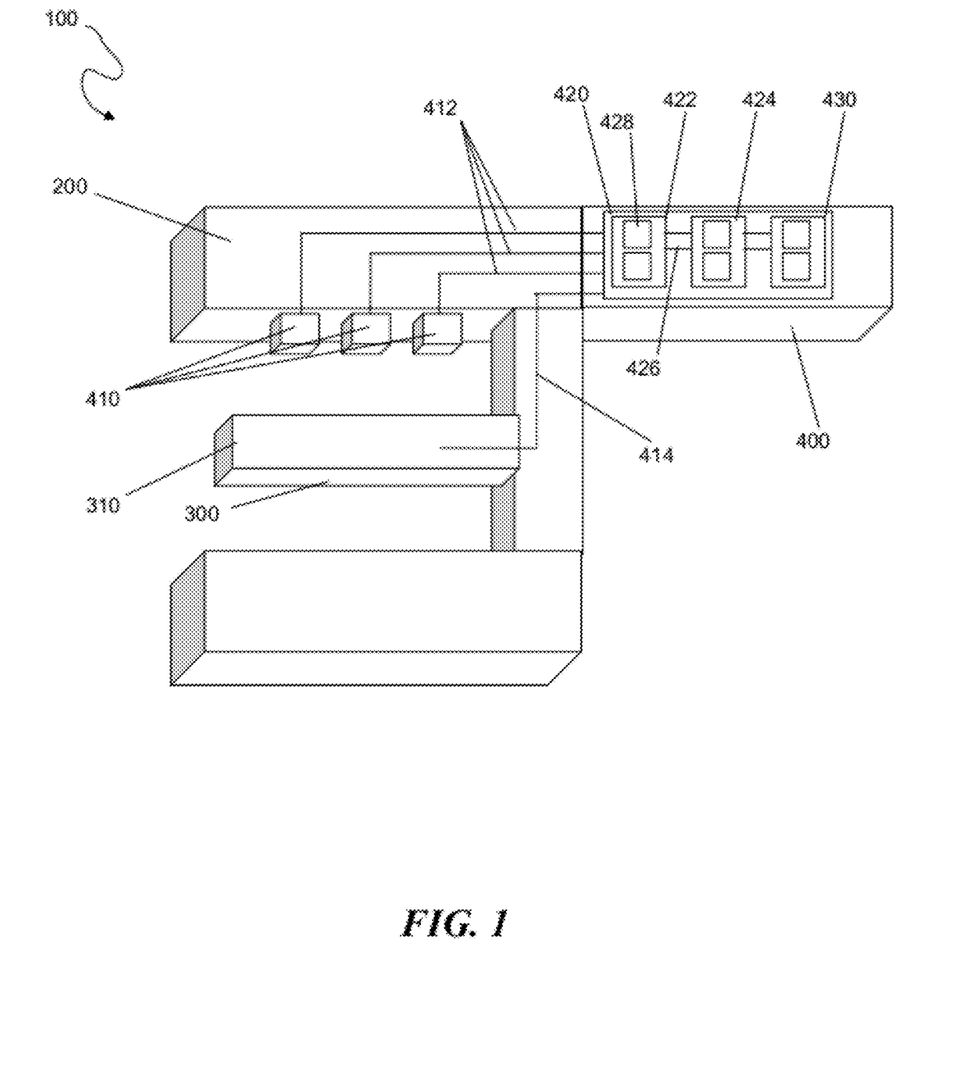
FIG. 1 is a schematic top view illustration of a MEMS in which an embodiment of the present invention is employed.
Figure 2:
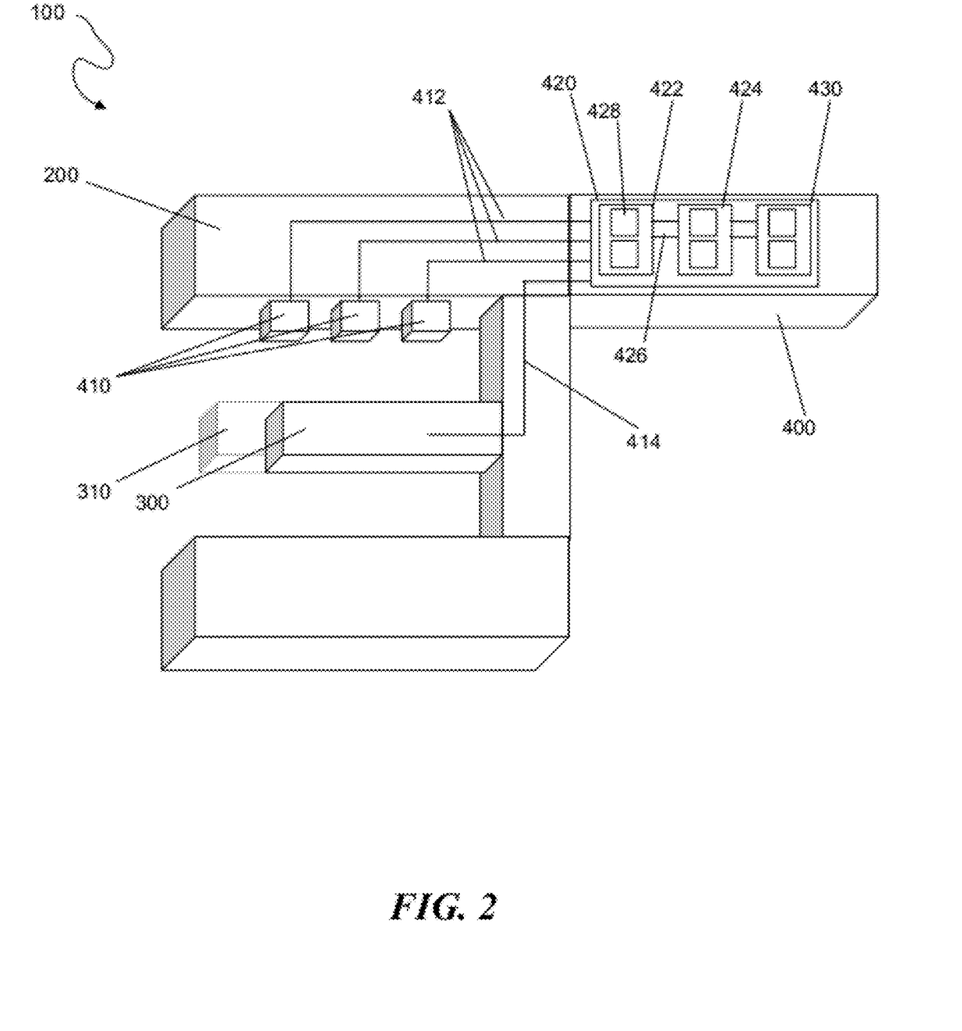
FIG. 2 is a schematic illustration of the MEMS of FIG. 1 in which a component failure has occurred.

With reference now to the accompanying drawings, and particularly now to FIGS. 1 and 2, a microelectromechanical structure (MEMS) 100 includes a support 200 and a component, such as a cantilevered beam 300. During the course of operation of the MEMS 100, breakage of the end 310 of the cantilevered beam 300 may occur, as seen in FIG. 2. Continued operation of the MEMS with broken end 310 of beam 300 could lead to undesirable results.

A MEMS component status detection structure 400 according to an embodiment of the present invention includes at least one sensor 410 arranged to monitor a component of MEMS 100, such as cantilevered beam 300. Each sensor 410 produces a detection signal received by a controller 420, such as via detection conductors 412, though the signal may be transmitted to controller 420 by other methods, such as via Bluetooth or other wireless connections, optical fiber, RFID, or any other suitable signal transmission arrangement now known or later developed. The particular type of sensor 410 employed may vary. For the example shown, each sensor 410 may be a capacitance-based sensor, such as a plate of conductive material formed on support structure 200 substantially parallel to beam 300.

A single sensor 410 may be used to monitor a particular area of interest of the monitored component, such as end 310 of beam 300. If multiple sensors 410 are used, they may be distributed to monitor the entire beam 300 or a portion of beam 300 as may be desired. In the case of sensors 410 that are conductive plates, the material used may be aluminum, polysilicon, or other suitable materials now known or later discovered. In addition, sensors 410 may be formed using microelectronics manufacturing techniques now known or later developed or discovered.

The controller 420 in embodiments receives the detection signals as mentioned above and uses the detection signals to indicate a status of the monitored component. For example, controller 420 may include a control circuit 422 that receives one or more of the detection signals and produces a notification signal based on the detection signals. A change in the notification signal of embodiments can act as an indicator and can include a change in voltage, logical state, current, or other characteristic. A notification device 424 may also be included that receives the notification signal, such as via notification conductors 426, and activates an indicator 430 responsive to the notification signal. For example, an indicator 430 could take the form of a light-emitting diode, a tone generator, a messaging device, or other suitable device that can notify a user of the change in status of the monitored component. In an embodiment, control circuit 422 includes a comparator 428 that receives one or more of the detection signals, compares it to a reference or known value, and produces a notification signal that will occupy a first state responsive to a first state of the detection signal and a second state responsive to a second state of the detection signal.

For example, with capacitance-based sensors, controller 420 may place a source charge on the monitored component, such as beam 300 via a source conductor 414, and use the source charge as a reference voltage value. When beam 300 is intact, then each sensor 410 will produce a detection signal in the form of a voltage that is higher than the source charge (a first state of the detection signal), and the notification signal will represent presence/integrity of beam 300 (a first state of the notification signal). In the event of breakage of beam 300, such as end 310 breaking off as shown in FIG. 2, then the detection signal from each sensor in the area where beam 300 is no longer present will decrease in strength (a second state of the detection signal), and comparator 428 will flip, changing the state of the notification signal to a second state representing failure of beam 300. In an embodiment, comparator 428 receives the detection signal of each sensor 410 one at a time and cyclically. In another embodiment, multiple comparators 428 are employed, such as one receiving each detection signal, and the output signals of comparators 428 themselves may be passed into additional comparators so that the notification signal occupies the second state reflecting failure of beam 300 responsive to one or more of the detection signals occupying a state representing failure of beam 300.

Alternatively, embodiments may employ a digital sensing system in which controller 420 produces a source signal toggling at a frequency that is transparent to the capacitive coupling of sensors 410. This source signal is then sent to beam 300, such as via source conductor 414, and each of sensors 410 is tested to determine if it detects a signal. The control circuit 422 connected to sensors 410 may be a flip flop in such embodiments and may be reset to zero, while the data input is held to a one. The detection signal from sensor 410 is used as a clock, and if the detection signal reflects the presence of beam 300, the flip flop output will remain zero, but if the detection signal reflects absence of beam 300, the flip flop output will switch to a one.

Figure 3:
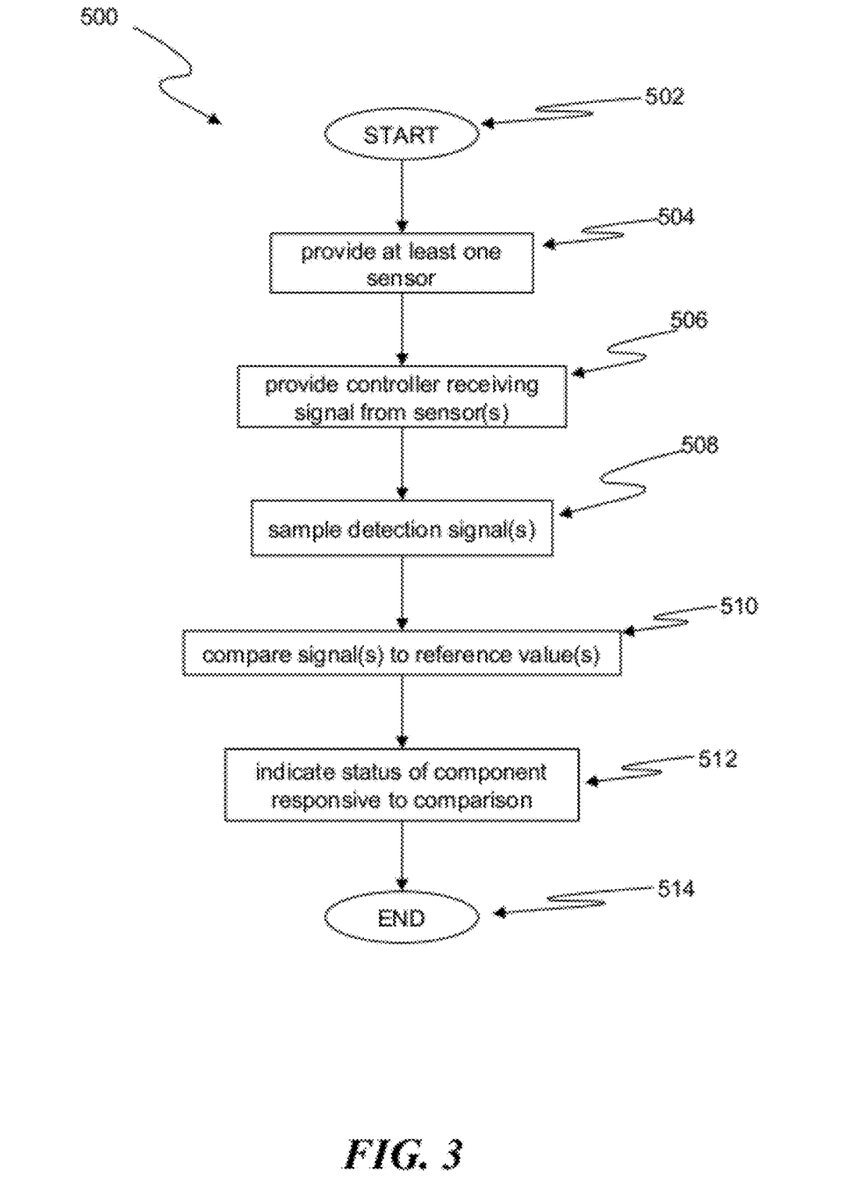
FIG. 3 is a schematic flow diagram of a method according to an embodiment of the present invention.

An embodiment of the invention can take the form of computer-implemented processes and apparatus for practicing such processes, such as is schematically illustrated in FIG. 3. As seen in FIG. 3, a method 500 in an embodiment starts (block 502) and includes providing at least one sensor (block 504). This may be done, for example, using known semiconductor techniques to fashion one or more sensors, such as plate-type capacitance-based sensors, in proximity to a MEMS component to be measured. Each sensor produces a detection signal, and a controller is provided (block 506) that samples the detection signal(s) (block 508). The detection signal(s) are compared to a reference value (block 510), and the status of the component being monitored is indicated responsive to the comparison (block 512). The process may end (block 514) or repeat as necessary and/or appropriate and/or desired.

Additionally, an embodiment can take the form of a computer program product including instructions for execution by a processing circuit, such as computer code in the form of, for example, object code, source code, and/or executable code, on tangible media, such as magnetic media (floppy diskettes, hard disc drives, tape, etc.), optical media (compact discs, digital versatile/video discs, magneto-optical discs, etc.), random access memory (RAM), read only memory (ROM), flash ROM, erasable programmable read only memory (EPROM), or any other computer readable storage medium on which the computer program code is stored and with which the computer program code can be loaded into and executed by a computer. Such is schematically illustrated, for example, in FIG. 4, which depicts a general purpose computer/computing system 800. When the computer executes the computer program code, it becomes an apparatus for practicing the invention, and on a general purpose microprocessor, specific logic circuits are created by configuration of the microprocessor with computer code segments. A technical effect of the executable instructions or computer code is to monitor the status of a MEMS component, for example, to alert an operator when the component is damaged.

Figure 4:
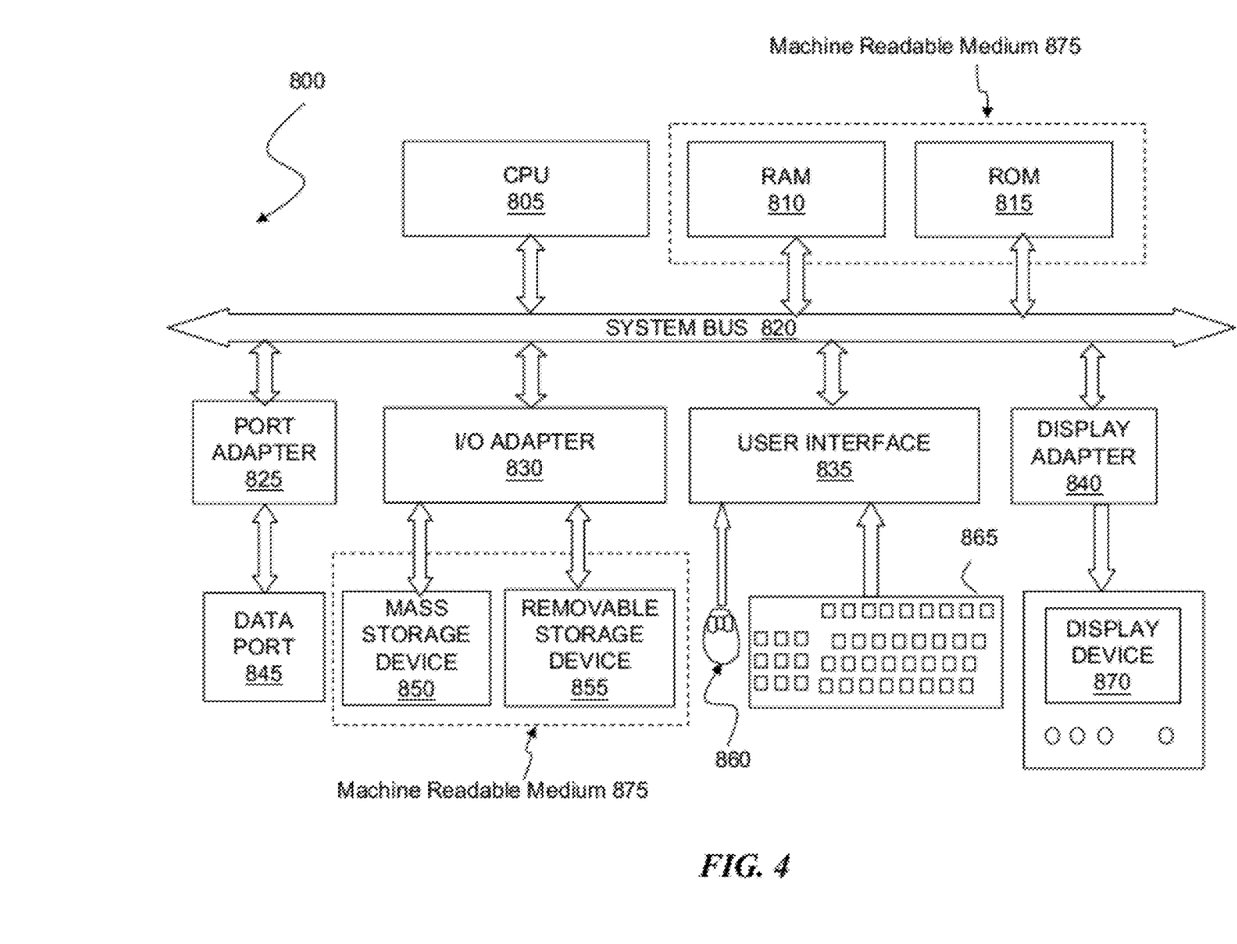
FIG. 4 is a schematic block diagram of a computing system for practicing and/or implementing embodiments of the present invention.

More specifically, FIG. 4 illustrates a block diagram of a general-purpose computer system which can be used to implement the circuit and circuit design structure described herein. The design structure may be coded as a set of instructions on removable or hard media for use by general-purpose computer. FIG. 4 is a schematic block diagram of a general-purpose computer for practicing the present invention. FIG. 4 shows a computer system 800, which has at least one microprocessor or central processing unit (CPU) 805. CPU 805 is interconnected via a system bus 820 to machine readable media 875, which includes, for example, a random access memory (RAM) 810, a read-only memory (ROM) 815, a removable and/or program storage device 855 and a mass data and/or program storage device 850. An input/output (I/O) adapter 830 connects mass storage device 850 and removable storage device 855 to system bus 820. A user interface 835 connects a keyboard 865 and a mouse 860 to system bus 820, and a port adapter 825 connects a data port 845 to system bus 820 and a display adapter 840 connect a display device 870. ROM 815 contains the basic operating system for computer system 800. Examples of removable data and/or program storage device 855 include magnetic media such as floppy drives, tape drives, portable flash drives, zip drives, and optical media such as CD ROM or DVD drives. Examples of mass data and/or program storage device 850 include hard disk drives and non-volatile memory such as flash memory. In addition to keyboard 865 and mouse 860, other user input devices such as trackballs, writing tablets, pressure pads, microphones, light pens and position-sensing screen displays may be connected to user interface 835. Examples of display device 870 include cathode-ray tubes (CRT) and liquid crystal displays (LCD).

A machine readable computer program may be created by one of skill in the art and stored in computer system 800 or a data and/or any one or more of machine readable medium 875 to simplify the practicing of this invention. In operation, information for the computer program created to run the present invention is loaded on the appropriate removable data and/or program storage device 855, fed through data port 845 or entered using keyboard 865. A user controls the program by manipulating functions performed by the computer program and providing other data inputs via any of the above mentioned data input means. Display device 870 provides a means for the user to accurately control the computer program and perform the desired tasks described herein.

Figure 5:
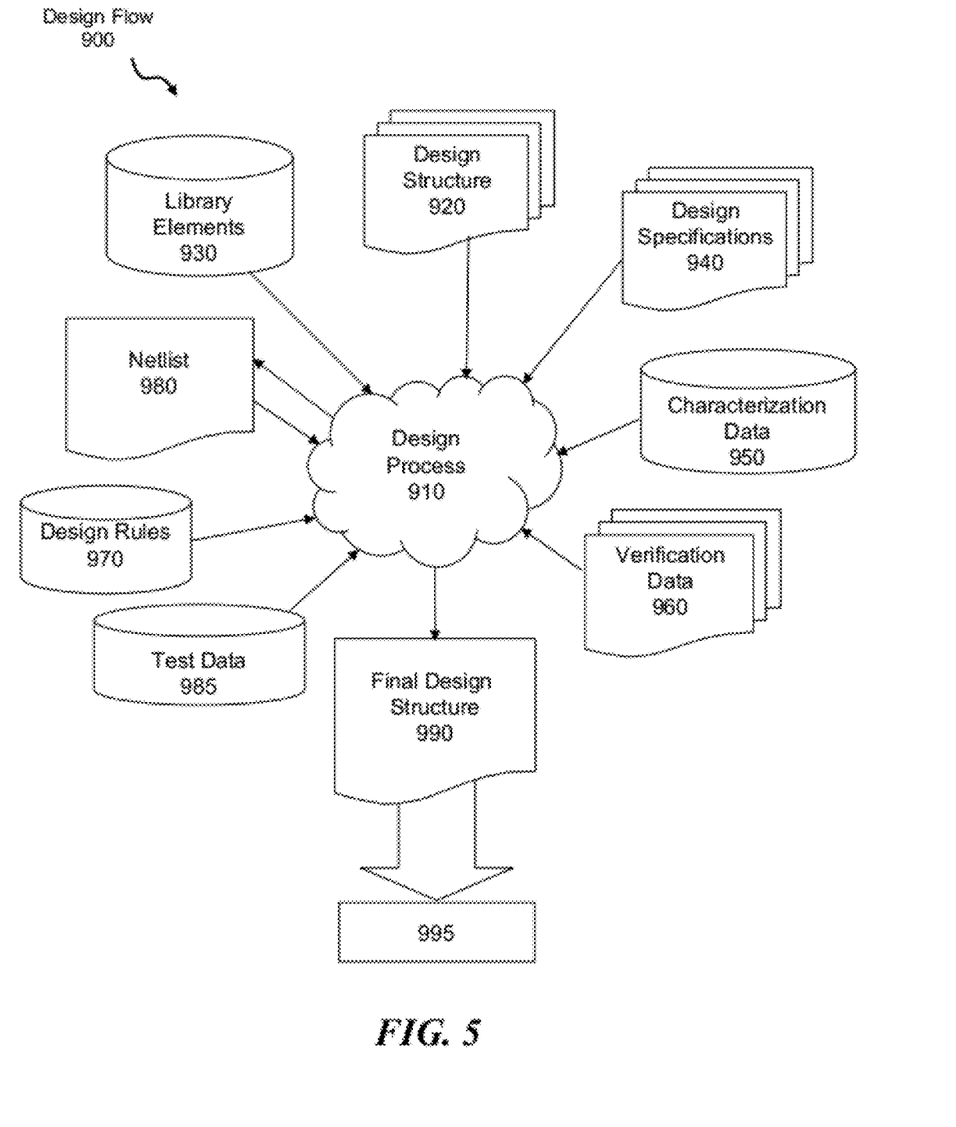
FIG. 5 is a schematic flow diagram of a design process with which the present invention may be practiced.

FIG. 5 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1 and 2. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 5 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1 and 2. As such, design structure 920 may comprise files or other data structures including human and/or machine-readable source code, compiled structures, and computer-executable code structures that, when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1 and 2 to generate a Netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which Netlist 980 is resynthesized one or more times depending on design specifications and parameters for the device. As with other design structure types described herein, Netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including Netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1 and 2. In one embodiment, design structure 990 may comprise a compiled, executable HDL simulation model that functionally simulates the devices shown in FIGS. 1 and 2.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1 and 2. Design structure 990 may then proceed to a stage 995 where, for example, design structure 990: proceeds to tape-out, is released to manufacturing, is released to a mask house, is sent to another design house, is sent back to the customer, etc.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention has been described, it will be understood that those skilled in the art, both now and in the future, may make various improvements and enhancements which fall within the scope of the claims which follow. These claims should be construed to maintain the proper protection for the invention first described.

What is claimed is:

1. A MEMS component status detection structure comprising:
   at least two sensors arranged to monitor respective portions of a MEMS component and that each produce at least one respective detection signal responsive to a characteristic of the respective monitored portion of the MEMS component indicative of a presence of the respective monitored portion;
   a control circuit that produces a notification signal responsive to a comparison of the at least one respective detection signal to a predefined value; and
   a notification device that produces an indication responsive to the notification signal and that indicates a status of the MEMS component.

2. The structure of claim 1 wherein the MEMS component is a cantilevered beam and the at least two sensors are supported substantially parallel to the beam.

3. The structure of claim 1 wherein the control circuit includes at least one comparator receiving and comparing the at least one respective detection signal to a predefined value.

4. The structure of claim 3 wherein the at least two sensors are capacitance-based and a detection signal thereof is indicative of a detected capacitance.

5. The structure of claim 4 wherein the at least one comparator includes a voltage comparator receiving a reference voltage to which the at least one respective detection signal is compared.

6. The structure of claim 1 wherein the notification device includes a light emitting diode.

7. The structure of claim 1 wherein a source signal is fed to the MEMS component and the at least two sensors are arranged to detect the source signal in the MEMS component such that each detection signal occupies a first state responsive to detection of the source signal and a second state responsive to an absence of the source signal.

8. The structure of claim 7 wherein the first state indicates a presence of the component.

9. The structure of claim 7 wherein the control circuit further comprises a flip-flop receiving the at least one respective detection signal, and wherein the flip-flop is set to a first state responsive to a presence of the source signal and the flip-flop is set to a second state responsive to an absence of the source signal.

10. The structure of claim 7 wherein the at least one respective detection signal is used as a clock.

11. A design structure embodied in a machine readable storage medium used in a design process, the design structure comprising:
    a controller having a control circuit and a notification device, the control circuit further including a source signal generator arranged to provide a source signal to a MEMS component;
    at least one sensor arranged to monitor the MEMS component and that sends to the controller at least one detection signal responsive to a characteristic of the MEMS component;
    wherein the control circuit includes a flip-flop arranged to receive the at least one detection signal and the control circuit produces a notification signal responsive to a comparison of the at least one detection signal to a predefined value, the flip-flop is set to a first state responsive to detection of the source signal in the at least one detection signal, and the flip-flop is set to a second state responsive to absence of the source signal in the at least one detection signal; and
    wherein the notification device produces an indication responsive to the notification signal that indicates a status of the MEMS component.

12. The design structure of claim 11 wherein the source signal generator produces a source signal that toggles between two values of an electrical quality.

13. The design structure of claim 11, wherein the at least one sensor is connected to the flip-flop one at a time.

14. The design structure of claim 11, wherein each of the at least one sensor is connected to a respective flip-flop.

15. A method of detecting status of a MEMS component comprising:
    arranging at least one sensor to monitor a respective portion of a MEMS component;
    providing a source signal to the MEMS component;
    sampling the at least one sensor to obtain a respective detection signal responsive to presence of the respective monitored portion of the MEMS component, the sampling including determining whether each respective detection signal reflects detecting the source signal by sending each respective detection signal to a flip-flop, the flip-flop occupying a first state responsive to detecting the source signal and the flip-flop occupying a second state responsive to an absence of the source signal; and a status of the MEMS component responsive to the state of the flip-flop notification signal.

16. The method of claim 15 further comprising activating an indicator responsive to a state of the notification signal.

17. The method of claim 15 wherein the providing of the source signal includes toggling an electrical quantity between at least two values.

18. The method of claim 17 wherein the determining whether each detection signal reflects detecting the source signal further comprises sending each respective detection signal to the flip-flop as a clock signal.

19. The method of claim 18, wherein each respective detection signal is sent to the flip-flop one at a time.

20. The method of claim 18, wherein each respective detection signal is sent to a respective flip-flop.

21. A MEMS component status detection structure comprising:

a controller arranged to produce a source signal that is fed to a MEMS component;

at least one sensor arranged to monitor the MEMS component and that produces at least one detection signal responsive to a characteristic of the MEMS component; and a control circuit of the controller that includes a flip-flop arranged to receive the at least one detection signal, wherein the flip-flop is set to one responsive to a presence of the source signal and the flip-flop is set to zero responsive to an absence of the source signal.

* * * * *